(12) United States Patent
Koga

(10) Patent No.: US 6,822,873 B2
(45) Date of Patent: Nov. 23, 2004

(54) STRUCTURE OF ELECTRONIC DEVICE PROVIDING DECREASED FATIGUE OF WIRE

(75) Inventor: Kazuhiko Koga, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/374,105

(22) Filed: Feb. 27, 2003

(65) Prior Publication Data

US 2003/0165050 A1 Sep. 4, 2003

(30) Foreign Application Priority Data

Mar. 4, 2002 (JP) ........................................ 2002-057338

(51) Int. Cl.⁷ .............................................. H05K 1/00
(52) U.S. Cl. ........................ 361/751; 361/746; 361/785
(58) Field of Search ................. 361/751, 746, 361/785; 174/280; 250/216, 239

(56) References Cited

U.S. PATENT DOCUMENTS

| | | | |
|---|---|---|---|
| 5,595,939 A | 1/1997 | Otake et al. | |
| 6,408,697 B1 | 6/2002 | Ootake et al. | |
| 6,627,872 B1 * | 9/2003 | FuKamura et al. | ......... 250/239 |

FOREIGN PATENT DOCUMENTS

| | | |
|---|---|---|
| JP | 2000-329633 | 11/2000 |
| JP | 2001-33335 | 2/2001 |
| JP | P2001-33335 A * | 2/2001 |
| JP | 3198779 | 6/2001 |

OTHER PUBLICATIONS

U.S. patent application Ser. No. 09/603,956, Chikuan et al., (corres. To JP2001–33335).

"Semiconductor Pressure Transducer" by Osamu Ina; Journal of Nippondenso Technical Disclosure; Apr. 20, 1979; p. 65 (w/English translation).

* cited by examiner

Primary Examiner—Randy W. Gibson
Assistant Examiner—Hung S. Bui
(74) Attorney, Agent, or Firm—Posz & Bethards, PLC

(57) ABSTRACT

An electronic device such as a semiconductor pressure sensor is provided which has a buffer disposed within a resinous casing. Terminals extend through the casing and connect electrically with an electronic element mounted on the casing through wires. The buffer is made of a material having a coefficient of thermal expansion smaller than that of the body of the casing, thereby decreasing undesirable movement of the terminals leading to fatigue of the wires which arises from a change in temperature of the casing. This minimizes a drop in mechanical strength of the wires caused by thermal cycling to which the casing is subjected.

17 Claims, 7 Drawing Sheets

STRUCTURE OF ELECTRONIC DEVICE PROVIDING DECREASED FATIGUE OF WIRE

BACKGROUND OF THE INVENTION

1. Technical Field of the Invention

The present invention relates generally to an improved structure of an electronic device equipped with a resinous casing, a terminal disposed within the casing, an electronic element, and a wire joining between the terminal and the electronic element, which is designed to decrease fatigue of the wire.

2. Background Art

FIGS. 8(a) and 8(b) illustrate a semiconductor device as an example of the above type of electronic devices. The semiconductor device is designed as a pressure sensor and has disposed thereon a semiconductor diaphragm sensor element 30 which is sensitive to atmospheric pressure acting thereon to provide an electrical signal indicative thereof.

The pressure sensor consists of a molded resinous casing 10, a plurality of metallic terminals 20, and wires 50. The terminals 20 extend through the casing 10 to have ends 21 and 22 exposed outside the casing 10. The sensor element 30 is mounted on the surface of the casing 10 and joined electrically to the terminals 20 through the wires 50 for output of the electrical signal indicative of the atmospheric pressure acting on the sensor element 30.

The above structure of the pressure sensor, however, encounters the drawback as discussed below.

When the pressure sensor is subjected to thermal cycling, i.e., a rise or a drop in ambient temperature, it will cause the resin forming the casing 10 to be expanded or contracted. The resin has a relatively great coefficient of thermal expansion, thus resulting in a great degree of expansion or contraction of the casing 10. This causes the terminals 20, as shown in FIG. 8(b), to be moved laterally in a direction Y parallel to the surface on which the sensor element 30 is mounted, thus resulting in fatigue of the wires 50, which may lead to breakage of the wires 50.

SUMMARY OF THE INVENTION

It is therefore a principal object of the invention to avoid the disadvantages of the prior art.

It is another object of the invention to provide an improved structure of an electronic device designed to minimize fatigue of wires joining between an electronic element and a terminal arising from a temperature change of a casing.

According to one aspect of the invention, there is provided an electronic device which may serve as a semiconductor pressure sensor. The electronic device comprises: (a) a casing having a body made of resin; (b) a metallic terminal having a length, the metallic terminal extending through the body of the casing to have ends thereof extending outside the body of the casing; (c) an electronic element mounted on a surface of the body of the casing; (d) a wire establishing an electrical connection between the electronic element and the end of the terminal; and (e) a buffer disposed adjacent the terminal within the body of the casing. The buffer is made of a material having a coefficient of thermal expansion smaller than that of the resin forming the body of the casing. Specifically, the buffer serves to suppress expansion or contraction of a portion of the body of the casing near the terminal which arises from a change in temperature of the casing, thereby decreasing undesirable movement of the terminal leading to fatigue of the wire. This minimizes a drop in mechanical strength of the wire caused by thermal cycling to which the casing is subjected.

In the preferred mode of the invention, the electronic device may also include a plurality of metallic terminals each having a length and ends exposed outside the body of the casing and wires connected between the ends of the metallic terminals and the electronic element. The buffer occupies between two of the terminals and/or between each of the terminals and an outer peripheral surface of the body of the casing. If a distance between the middle between the two of the terminals and each of the terminals and a distance between each of the terminals and the middle between each of the terminals and the outer peripheral surface of the casing are defined as L, the buffer occupies over 0.9L from each of the middles to the terminals. This positional relation between the buffer and the terminals maximizes the above activities of the buffer.

The buffer may be made of one of a metal and a ceramic material.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1A:
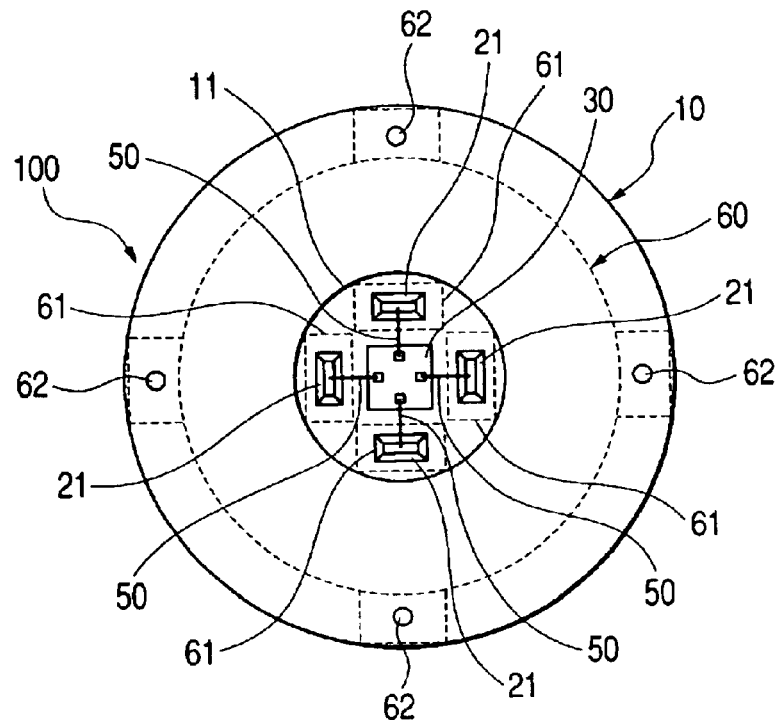
FIG. 1(a) is a top view which shows a pressure sensor according to the first embodiment of the invention.
Figure 1B:
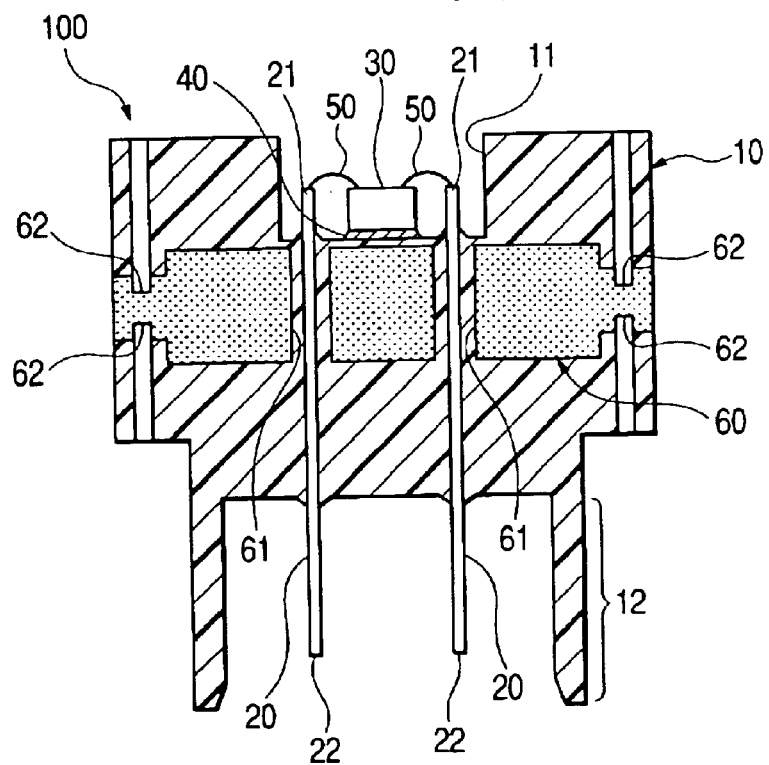
FIG. 1(b) is a longitudinal sectional view of FIG. 1(a)

Referring to the drawings, wherein like reference numbers refer to like parts in several views, particularly to FIGS. 1(a) and 1(b), there is shown a pressure sensor 100 according to the first embodiment of the invention.

The pressure sensor 100 consists essentially of a casing 10, a sensor element 30, and a buffer 60. The casing 10 is made by, for example, injection molding a thermoplastic material such as polybutyleneterephthalate (PBT) or polyphenylene sulfide (PPS) or molding a thermosetting material such as epoxy.

The casing 10 has at least two terminals 20 (four in this embodiment) installed therewithin by insert molding. The terminals 20 are made of metal such as brass and plated with gold or tin. Each of the terminals 20, as can be seen from FIG. 1(a), extends through the casing 10 to have ends 21 and 22 projecting therefrom.

The casing 10 has a recess 11 formed in an end thereof. The sensor element 30 which works to measure a physical pressure acting on a surface thereof is mounted on the bottom of the recess 11. The casing 10 has an annular extension 12 functioning as a connector for connection to an external. The ends 21 and 22 of each of the terminals 21 lie within the recess 11 and the connector 12, respectively.

The sensor element 30 is of a diaphragm type semiconductor pressure sensor and bonded to the bottom of the recess 11 of the casing 10 using an adhesive 40 such as a silicone resin. The sensor element 30 has electrodes formed on the surface thereof which are joined electrically to the ends 21 of the terminals 20 through bonding wires 50 made of, for example, gold or aluminum.

The sensor 100 may be employed as an atmospheric sensor which is responsive to the ambient pressure acting on the surface thereof to produce an electric signal as a function of the ambient pressure through the sensor element 30. The electric signal is outputted to the external through the wires 50 and the terminals 20.

The buffer 60 is disposed within the casing 10 surrounding portions of the terminals 20. The buffer 60 has the coefficient of thermal expansion smaller than a resin material forming a major portion of the casing 10 and occupies between the terminals 20 and between the terminals 20 and the outer peripheral surface of the casing 10.

The buffer 60 is made by molding or cutting a ceramic or metal material lower in coefficient of thermal expansion than resin and installed within the casing 10 by the insert molding. The buffer 60 is of a disc shape and has holes 61 through which the terminals 20 extend.

The buffer 60 also has holes 62 formed in an outer peripheral portion thereof which are used to retain the buffer 60 within a mold when the resin material is molded into the casing 10. The retaining of the buffer 60 within the mold is achieved by inserting portions of the mold into the holes 62.

The buffer 60 is, as illustrated, embedded within the casing 10 as a whole, but however, may have portions exposed outside the casing 10.

In order to improve adhesion between the buffer 60 and the resin of the casing 10, it is preferable to form the surface of the buffer 60 to be irregular. For instance, it may be achieved by roughening the inner surface of a mold used to form the buffer 60 or shot-blasting the surface of the buffer 60 itself.

The production of the pressure sensor 1 may be made in the following manner. First, the buffer 60 and terminals 20 are placed within the mold, after which resin is injected into the mold and hardened to form the casing 10. Next, the sensor element 30 is joined to the recess 11 of the casing through the adhesive 40. The wires 50 are bonded to the sensor element 30 and the terminals 20 to make electrical connections therebetween.

The buffer 60 is, as described above, disposed within the casing 10 so that it surrounds the portions of the terminals 20. The buffer 60 has the coefficient of thermal expansion lower than that of the resin forming the body of casing 10 and thus serves to suppress thermal expansion and contraction of a portion of the casing 10 near the terminals 20 when subjected to thermal cycling. Specifically, when the ambient temperature drops, it will cause the body of the casing 10 to contract to draw each of the terminals 20 toward the center of the casing 10 in parallel to the bottom of the recess 11, thus resulting in a decreased distance between adjacent two of the terminals 20. Conversely, when the ambient temperature rises, it will cause the body of the casing 10 to expand to move each of the terminals 20 outward in parallel to the bottom of the recess 11, thus resulting in an increased distance between the terminals 20.

The above movement of the terminals 20 arising from the temperature change is minimized by activities of the buffer 60. Specifically, the buffer 60 partially occupies between the terminals 20 within the casing 10 and works to suppress the thermal expansion and contraction of a central portion of the casing 10 lying inward of the terminals 20. The buffer 60 also occupies outside the terminals 20 and works to suppress the thermal expansion and contraction of an outer portion of the casing 10 surrounding the terminals 20.

Therefore, the thermal expansion and contraction of the casing 10 is decreased by the buffer 60 to minimize undesirable lateral shifts of the terminals 20 within the casing 10 causing the wires 50 to be bent or stretched when subjected to a change in temperature of the casing 10. This results in greatly decreased fatigue of the wires 50 arising from cyclic changes in ambient temperature of the pressure sensor 100, thus increasing the lifespan of the wires 50.

It is advisable that the buffer 60 be disposed within the casing 10 as close to the terminals 20 as possible for minimizing the lateral shifts of the terminals 20.

Figure 2:
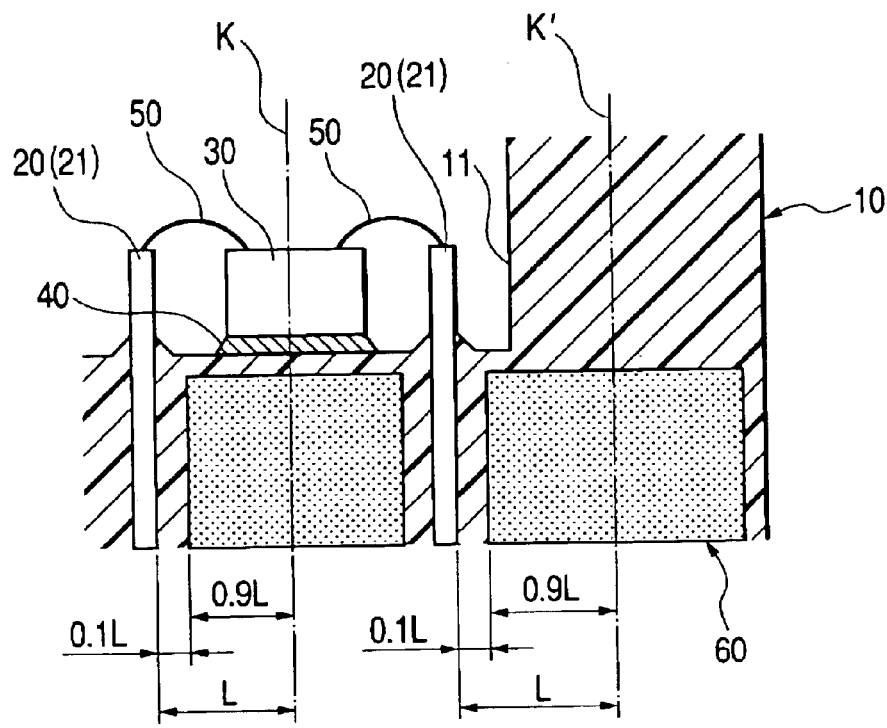
FIG. 2 is a partially sectional view which shows a positional relation between each terminal and a buffer.

Specifically, if the longitudinal center lines, as illustrated in FIG. 2, between opposed two of the terminals 20 and between each of the terminals 20 and the outer peripheral surface of the casing 10 is defined as K and K', and the distances between each of the terminals 20 and the center lines K and K' are defined as L, the buffer 60 occupies preferably over 0.9L from the center lines K and K', respectively. In other words, the minimum distance between each of the terminals 20 and the buffer 60 within a range between opposed two of the terminals 20 and the minimum distance between each of the terminals 20 and the buffer 60 within a range between the terminal 20 and the outer periphery of the casing 10 lie preferably within a range of less than or equal to 0.1L.

The above positional relation between the terminals 20 and the buffer 60 offers the advantages as discussed below.

The beneficial effects provided by the inside portion of the buffer 60 disposed inward of the terminals 20, that is, within a range between two of the terminals 20 will be described. Substantially the same effects are also provided by the outside portion of the buffer 60 disposed between the terminals and the outer peripheral surface of the casing 10, and explanation thereof in detail will be omitted here.

Usually, a rise or drop in ambient temperature will result in thermal expansion or contraction of a resinous member. The coefficient α of linear expansion of the resin is generally greater than those of ceramic and metal. Typical values of the coefficients α of the metal and ceramic such as alumina are approximately $12 \times 10^{-6}$ (1/° C.) and $4 \times 10^{-6}$ (1/° C.), respectively, while PBT and PPS have approximately $100 \times 10^{-6}$ (1/° C.) and $30 \times 10^{-6}$ (1/° C.), respectively, which are several times or several tens of times those of the metal and ceramic.

Figure 3:
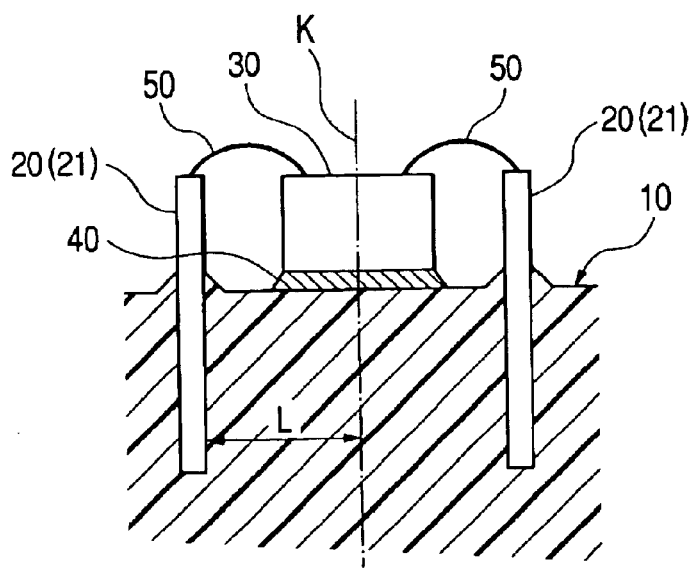
FIG. 3 is a partially sectional view which shows a portion of a casing around a sensor element of a conventional pressure sensor, as illustrated in FIGS. 8(a) and 8(b)
Figure 8A:
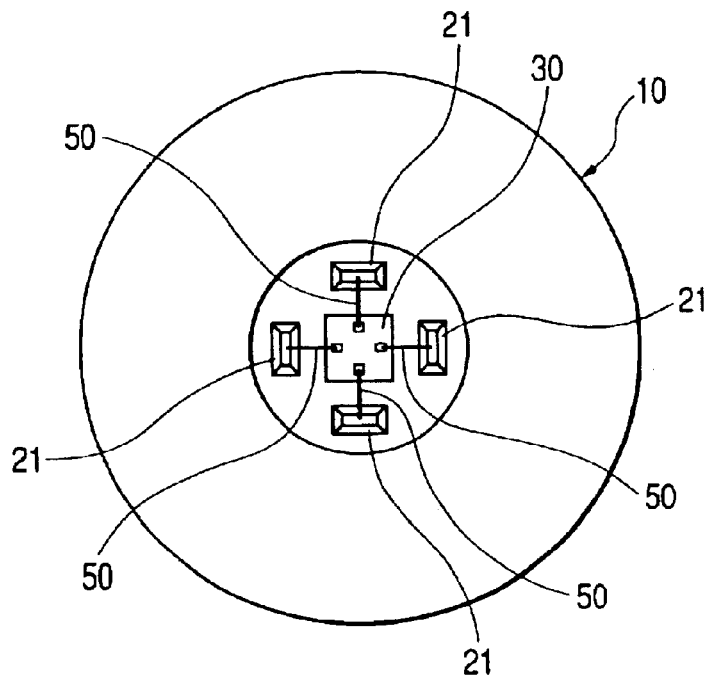
FIG. 8(a) is a top view which shows a conventional pressure sensor.
Figure 8B:
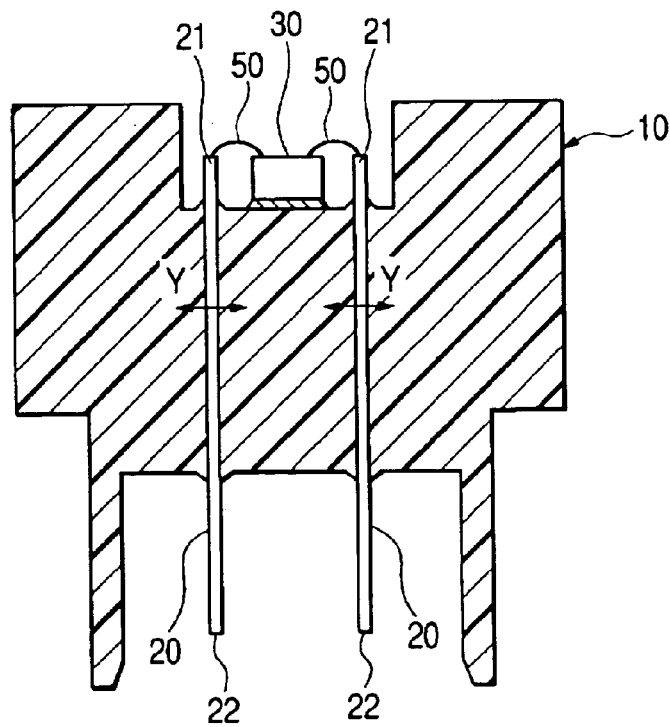
FIG. 8(b) is a longitudinal sectional view of FIG. 8(a).

Consider a case where conventional electronic devices undergo the above thermal expansion or contraction. FIG. 3 is a partially sectional view which shows a portion of the casing 10 around the sensor element 30 of the conventional pressure sensor as illustrated in FIGS. 8(a) and 8(b). If the casing 10 is made of PBT and subjected to a temperature change $\Delta T=100°$ C., a shift $\Delta L$ of each of the terminals 20 at the surface on which the sensor element 30 is mounted is given by the following formula.

$$\Delta L = L \times \alpha \times \Delta T = L \times (100 \times 10^{-6}) \times 100 = 0.01L \quad (1)$$

where L is the distances, as already described in FIG. 2, between each of the terminals 20 and the center lines K and K'.

From Eq. (1), it is found that a change in distance L between each of the terminals 20 and the center line K is 1% thereof.

If the distance between the buffer 60 and each of the terminals 20 of the pressure senor 100 of this embodiment is, as shown in FIG. 2, 0.1L, the casing 10 is made of PBT, and the buffer 60 is made of alumina, the shift $\Delta L$ of the terminals 20 is expressed as $$\Delta L = \{0.1L \times (100 \times 10^{-6}) + 0.9L \times (4 \times 10^{-6})\} \times 100 \quad (2)$$
$$= 0.00136L$$

From Eq. (2), it is found that by setting the distance between the buffer 60 and each of the terminals 20 to 0.1L, a change in distance L between each of the terminals 20 and the center line K will be 0.136% that is less than one seventh (1/7) of that of the conventional pressure sensor.

Figure 4:
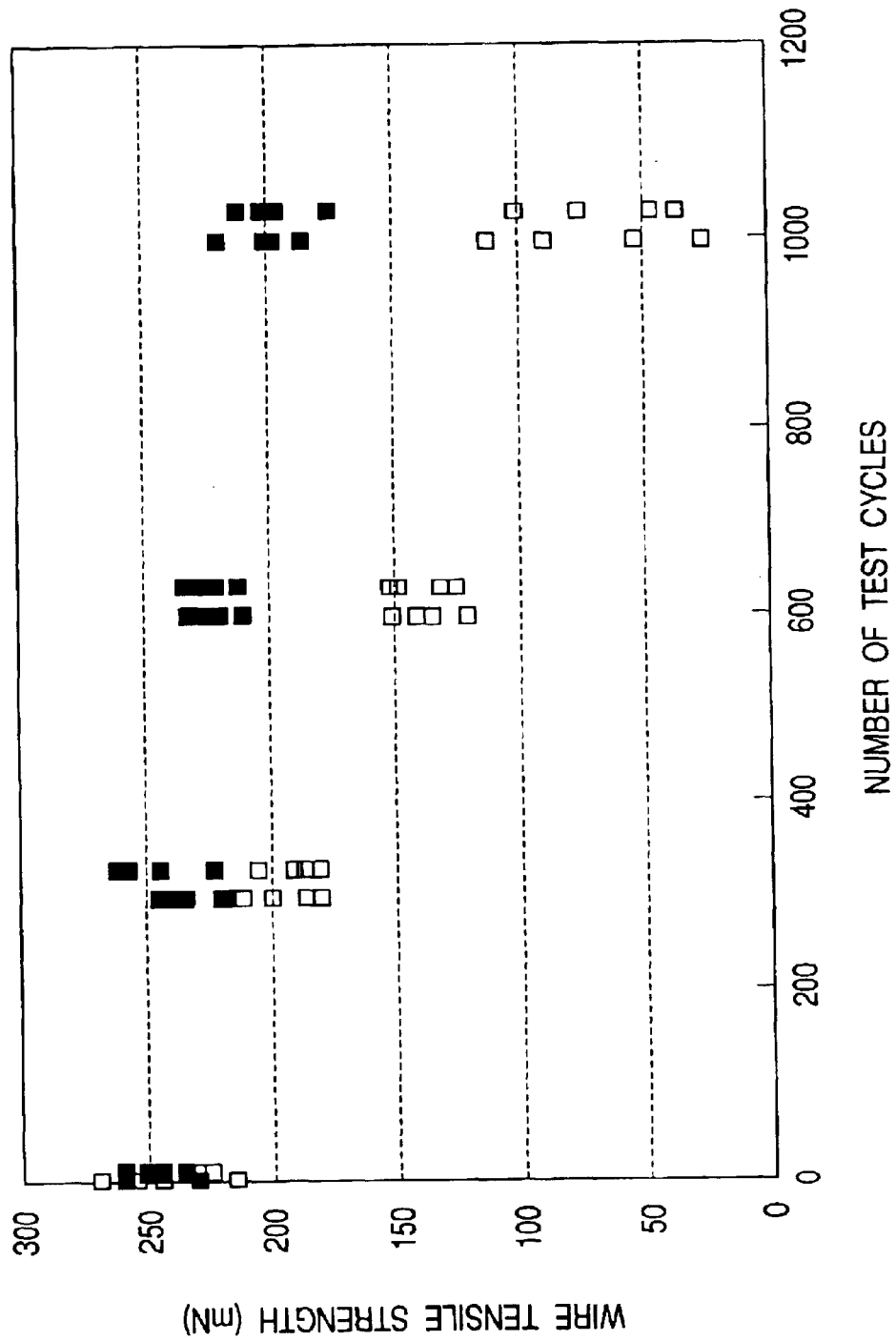
FIG. 4 is a graph which shows changes in tensile strength of wires 50 of a pressure sensor of the first embodiment and a conventional pressure sensor, as shown in FIGS. 8(a) and 8(b) when they are subjected to thermal cycling.

FIG. 4 illustrates changes in tensile strength of the wires 50 of the pressure sensor 100 of this embodiment and the conventional pressure sensor as shown in FIGS. 8(a) and 8(b) when they are subjected to thermal cycling. The casing 10 of each of the pressure sensor 100 and conventional pressure sensor is made of PPS. The buffer 60 is made of alumina. The wires are made of aluminum wires having a diameter of 30 μm. Thermal cycling tests were performed in which each sensor was placed at −30° C. for one hour and at −120° C. for one hour during one cycle.

The abscissa axis indicates the number of thermal test cycles, and the ordinate axis indicates the tensile strength (mN) of the wires 50. Plotted black rectangles denote the pressure sensor 100 of this embodiment. Plotted white rectangles denote the conventional pressure sensor. The graph shows that the pressure sensor 100 is smaller in drop in fatigue of the wires 50 than the conventional pressure sensor and has an extended service life.

Figure 5A:
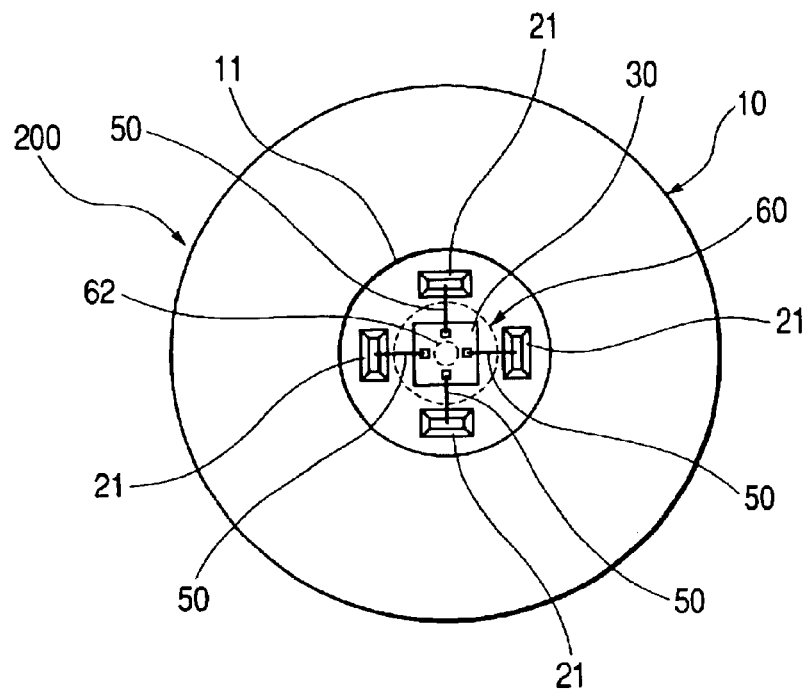
FIG. 5(a) is a top view which shows a pressure sensor according to the second embodiment of the invention.
Figure 5B:
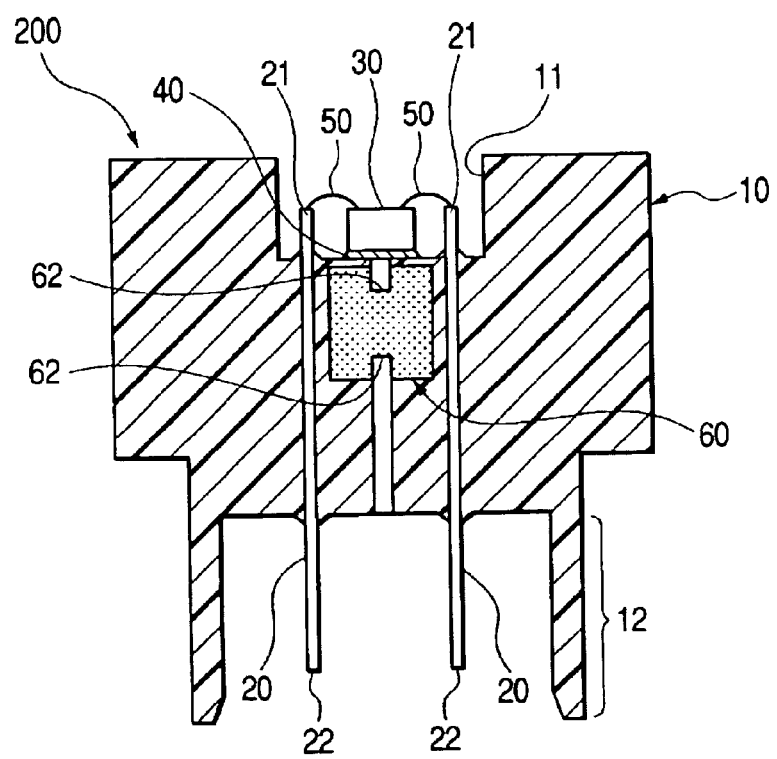
FIG. 5(b) is a longitudinal sectional view of FIG. 5(a)

FIGS. 5(a) and 5(b) illustrate the pressure sensor 200 according to the second embodiment of the invention.

The buffer 60 is of a cylindrical shape and installed only inside the terminals 20. The buffer 60 has holes 62 formed on ends thereof for installation thereof in a mold when the casing 10 is formed.

The buffer 60, like the first embodiment, works to decrease the inward shifts of the terminals 20 when subjected to a drop in temperature, however, permits the terminals 20 to be moved outward by thermal expansion of a portion of the resin around and outside the terminals 20 to a greater extent than in the first embodiment when the casing 10 is subjected to a rise in temperature. The buffer 60 is, however, disposed only inside the terminals 20 and has a simplified structure of the pressure sensor 200, thereby resulting in a decrease in manufacturing cost of the pressure sensor 200.

It is advisable that the buffer 60 have the same positional relation, as described in the first embodiment, to the terminals 20.

Figure 6A:
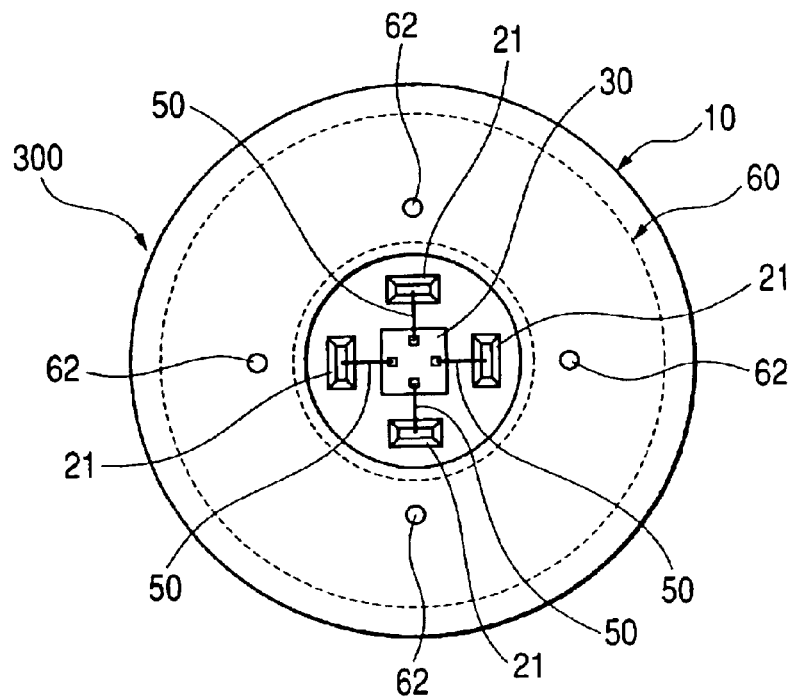
FIG. 6(a) is a top view which shows a pressure sensor according to the third embodiment of the invention.
Figure 6B:
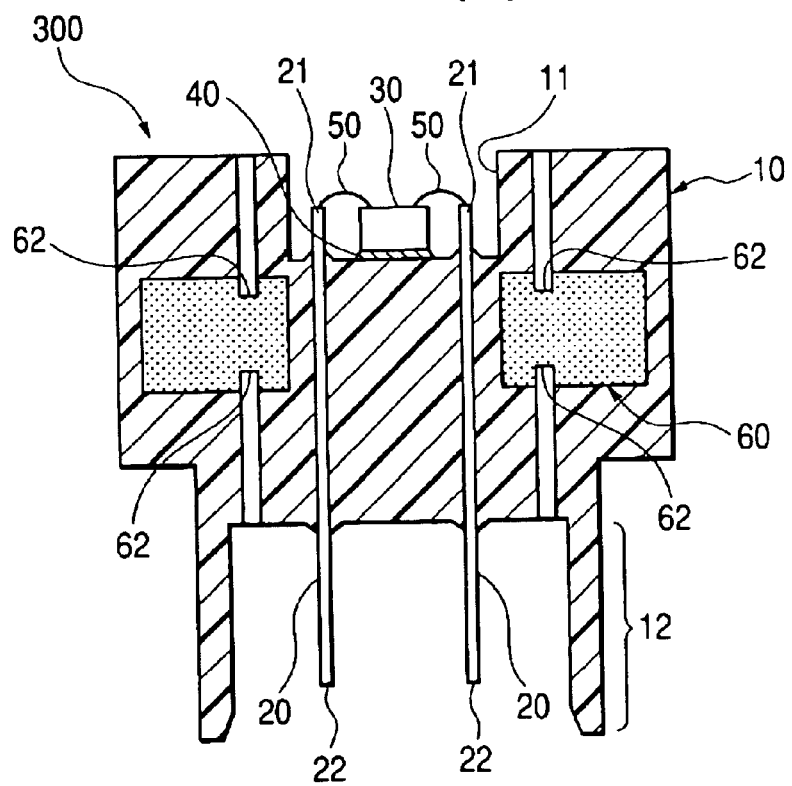
FIG. 6(b) is a longitudinal sectional view of FIG. 6(a)

FIGS. 6(a) and 6(b) illustrate the pressure sensor 300 according to the third embodiment of the invention.

The buffer 60 is of a ring shape and installed only outside the terminals 20. The buffer 60 has holes 62 formed on end surfaces thereof for installation thereof in a mold when the casing 10 is formed.

Specifically, the buffer 60 has formed therein a central hole within which the terminals 20 are arranged. The buffer 60, like the first embodiment, works to decrease the outward shifts of the terminals 20 when subjected to a rise in temperature, however, permits the terminals 20 to be moved inward by thermal contraction of a portion of the resin around and inside the terminals 20 to a greater extent than in the first embodiment when the casing 10 is subjected to a drop in temperature. The buffer 60 is, however, disposed only outside the terminals 20 and has a simplified structure of the pressure sensor 200, thereby resulting in a decrease in manufacturing cost of the pressure sensor 200.

It is advisable that the buffer 60 have the same positional relation, as described in the first embodiment, to the terminals 20.

Figure 7A:
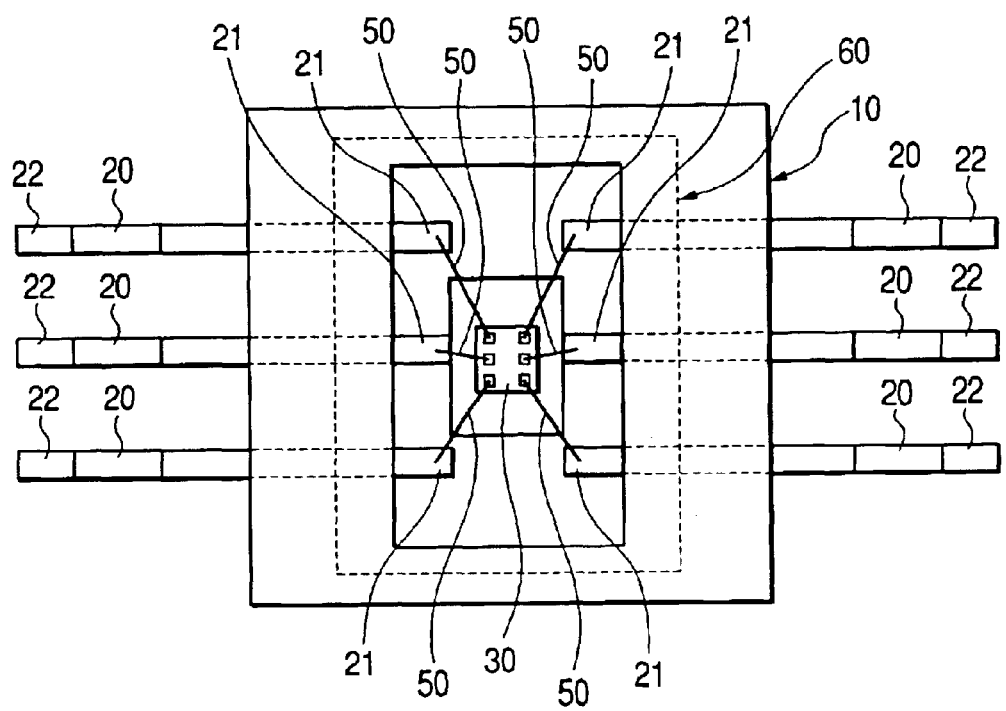
FIG. 7(a) is a top view which shows a pressure sensor according to the fourth embodiment of the invention.
Figure 7B:
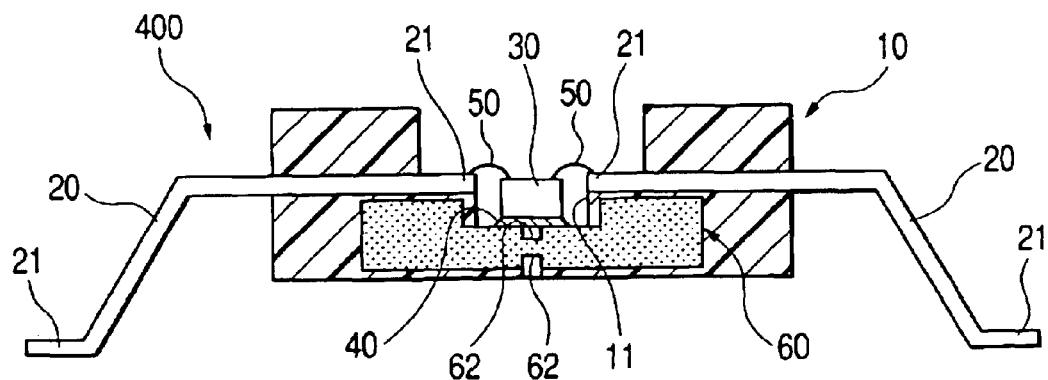
FIG. 7(b) is a longitudinal sectional view of FIG. 7(a)

FIGS. 7(a) and 7(b) illustrate the pressure sensor 400 according to the fourth embodiment of the invention.

The casing 10 has the terminals 20 extending, like dual in-line packages, in parallel to the surface on which the sensor element 30 is mounted.

The buffer 60 is of a rectangular shape and installed within the casing 10 beneath, as shown in FIG. 7(b), the terminals 20. The buffer 60, like the above embodiments, works to withstand expansion and contraction of a portion of the resin near the terminals 20 when subjected to a temperature change, thereby minimizing the thermal fatigue of the wires 50.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments witch can be embodied without departing from the principle of the invention as set forth in the appended claims. For example, the buffer 60, unlike the above embodiments, may be placed in direct contact with a portion or whole of each of the terminals 20 if the buffer 60 is made of an insulating material such as ceramic.

Instead of the terminals 20, a single terminal may be installed in the casing 10. The structure of the invention, as described above, may also be used with electronic devices such as gas sensors, flow sensors, or infrared sensors. Instead of the sensor element 30, another electronic part or a circuit substrate may be mounted on the casing 10 in connection with the terminals 20 through the wires 50.

What is claimed is:

1. An electronic device comprising:
   a casing having a body made of resin;
   a metallic terminal having a length, said metallic terminal extending through the body of said casing to have ends thereof extending outside the body of said casing;
   an electronic element mounted on a surface of the body of said casing;
   a wire establishing an electrical connection between said electronic element and the end of said terminal; and
   a buffer disposed adjacent said terminal within the body of said casing, said buffer being made of a material having a coefficient of thermal expansion smaller than that of the resin forming the body of said casing.

2. An electronic device as set forth in claim 1, further comprising a plurality of metallic terminals each having a length and ends exposed outside the body of said casing and wires connected between the ends of said metallic terminals and said electronic element, and wherein said buffer occupies between two of said terminals and between each of said terminals and an outer peripheral surface of the body of said casing, and wherein if a distance between a middle between the two of said terminals and each of said terminals and a distance between each of said terminals and a middle between each of said terminals and the outer peripheral surface of said casing are defined as L, the buffer occupies over O.9L from each of the middles to the terminals.

3. An electronic device as set forth in claim 1, further comprising a plurality of metallic terminals each having a length and ends exposed outside the body of said casing and wires connected between the ends of said terminals and said electronic element, and wherein said buffer occupies between two of said metallic terminals.

4. An electronic device as set forth in claim 3, wherein if a distance between a middle between the two of said metallic terminals and each of said terminals is defined as L, the buffer occupies over 0.9L from the middle to the terminals.

5. An electronic device as set forth in claim 1, further comprising a plurality of metallic terminals each having a length and ends exposed outside the body of said casing and wires connected between the ends of said terminals and said electronic element, and said buffer occupies between each of said terminals and an outer peripheral surface of the body of said casing.

6. An electronic device as set forth in claim 5, wherein if a distance between each of said terminals and a middle between each of said terminals and the outer peripheral surface of said casing is defined as L, the buffer occupies over 0.9L from each of the middle to the outer peripheral surface of said casing.

7. An electronic device as set forth in claim 1, wherein said buffer is made of one of a metal and a ceramic material.

8. An electronic device comprising:
   a casing formed of resin;
   a metallic terminal extending through the casing such that ends thereof extend outside the casing;
   an element mounted on a surface of the casing and electrically connected to the metallic terminal; and
   a buffer disposed within the casing and surrounding the metallic terminal,
   wherein the buffer is formed of a material having a coefficient of thermal expansion smaller than the resin forming the casing.

9. An electronic device as set forth in claim 8, further comprising:
   a plurality of metallic terminals each extending through the casing such that ends thereof extend outside the casing, the plurality of metallic terminals formed in an opposed arrangement; and
   a plurality of wires connected between the element and the plurality of metallic terminals,
   wherein the buffer is disposed within the casing and surrounds the plurality of metallic terminals such that the buffer is located on an inside of the opposed arrangement between the plurality of terminals, between each of the plurality of terminals, and on an outside of the plurality of terminals between the plurality of terminals and an outer surface of the casing, and
   wherein the buffer occupies greater than 90% of a distance L defined as one or more of: the distance between opposing ones of the plurality of terminals on the inside of the opposed arrangement, and the distance between the plurality of terminals on an outside of the opposed arrangement and the outer surface of the casing.

10. An electronic device as set forth in claim 8, further comprising a second metallic terminal formed in an opposed arrangement with the metallic terminal, wherein the buffer further surrounds the second metallic terminal and occupies over 0.9L of a distance L between the metallic terminal and the second metallic terminal on an inside of the opposed arrangement.

11. An electronic device as set forth in claim 8, wherein the buffer occupies over 0.9L of a distance L from the metallic terminal to an outer surface of the casing.

12. An electronic device as set forth in claim 8, wherein the material further includes one of a metal and a ceramic.

13. A structure capable of reducing thermal fatigue in an electronic device, the structure comprising:
   a casing formed of resin;
   a metallic terminal extending through the casing such that ends thereof extend outside the casing the metallic terminal capable of being coupled to the electronic device; and
   a buffer disposed within the casing and surrounding the metallic terminal,
   wherein the buffer is formed of a material having a coefficient of thermal expansion smaller than the resin forming the casing.

14. A structure as set forth in claim 13, further comprising:
   a plurality of metallic terminals each extending through the casing such that ends thereof extend outside the casing, the plurality of metallic terminals fanned in an opposed arrangement; and
   wherein the buffer is disposed within the casing and surrounds the plurality of metallic terminals such that the buffer is located on an inside of the opposed arrangement between the plurality of terminals, between each of the plurality of terminals, and on an outside of the plurality of terminals between the plurality of terminals and an outer surface of the casing, and
   wherein the buffer occupies greater than 90% of a distance L defined as one or more of: the distance between opposing ones of the plurality of terminals on the inside of the opposed arrangement, and the distance between the plurality of terminals on an outside of the opposed arrangement and the outer surface of the casing.

15. A structure as set forth in claim 13, further comprising a second metallic terminal formed in an opposed arrangement with the metallic terminal, wherein the buffer further surrounds the second metallic terminal and occupies over 0.9L of a distance L between the metallic terminal and the second metallic terminal on an inside of the opposed arrangement.

16. A structure as set forth in claim 13, wherein the buffer occupies over 0.9L of a distance L from the metallic terminal to an outer surface of the casing.

17. A structure as set forth in claim 13, wherein said buffer is made of one of a metal and a ceramic material.

* * * * *